United States Patent [19]

Jahn et al.

[11] Patent Number: 4,710,850
[45] Date of Patent: Dec. 1, 1987

[54] TOWER DESIGN FOR HIGH-VOLTAGE SYSTEMS

[75] Inventors: Herbert Jahn, Erlangen; Günter Waedt, Forchheim, both of Fed. Rep. of Germany

[73] Assignee: Siemens Aktiengesellschaft, Munich, Fed. Rep. of Germany

[21] Appl. No.: 3,933

[22] Filed: Jan. 16, 1987

[30] Foreign Application Priority Data

Feb. 19, 1986 [DE] Fed. Rep. of Germany ....... 3605337

[51] Int. Cl.$^4$ .............................................. H02B 5/00
[52] U.S. Cl. .................................... 361/333; 361/429; 248/676; 52/167; 174/150
[58] Field of Search ...................... 174/141 R, 150 X; 361/331, 332, 333, 385, 417, 419, 420, 429; 307/147, 148; 363/141, 144; 200/48 R, 301; 248/638, 676; 52/167

[56] References Cited

U.S. PATENT DOCUMENTS

| | | | |
|---|---|---|---|
| 3,504,268 | 3/1970 | Hoffmann | 363/141 |
| 3,796,017 | 3/1974 | Meckler | 52/167 |
| 4,577,826 | 3/1986 | Bergstrom | 361/333 |
| 4,660,799 | 4/1987 | Butland | 248/676 |

FOREIGN PATENT DOCUMENTS

| | | |
|---|---|---|
| 0076439 | 9/1982 | European Pat. Off. |
| 1273074 | 7/1968 | Fed. Rep. of Germany |
| 2250201 | 9/1974 | France |

Primary Examiner—G. P. Tolin
Attorney, Agent, or Firm—Kenyon & Kenyon

[57] ABSTRACT

The invention relates to a tower design for high-voltage systems consisting of several stories (2 to 12) which are connected to each other by means of insulators, where each story (2 to 12) comprises support bars (16) of electrically insulating material and cup-shaped node elements (24). According to the invention, the support bars (16) and metallic cross bars (26) enclose a rectangular area by means of the node elements (24) a supporting rib structure (32) of insulating transverse and longitudinal supports (34 and 36) is arranged, and that a cylindrical support body (42) with an axially arranged cylindrical core (44) is provided as the cup-shaped node element (24), where the cylinder surface (46) of the node element (24) is provided with two fastening posts (38) which are arranged at right angles to each other and at right angles to the end faces (48) of the support body (42). Thereby, a tower design for high-voltage systems is obtained which can be constructed by a building block system independently of the transmission power and/or the number of active components (14).

8 Claims, 3 Drawing Figures

TOWER DESIGN FOR HIGH-VOLTAGE SYSTEMS

BACKGROUND OF THE INVENTION

1. Field of Invention

The invention relates to a tower design for high-voltage systems consisting of several stories which are coupled to each other by means of insulators, wherein each story comprises support bars of electrically insulating material and cup-shaped node elements.

2. Description of the Prior Art

A frame built of identical node and support elements screwed together in a building block system for a static converter is known from U.S. Pat. No. 3,913,003. The thyristors of the converter are fastened to the node elements, wherein the node elements serve as current carrying member to the thyristors. Each support for each story of the frame comprises at least one node element which is designed as a cup with several plane lateral surfaces. The node elements of each support are screwed together via support elements of electrically insulating material. Thus, a converter can be constructed in a building block system for different voltages from the same components wherein at least part of the current-carrying members is integrated into the building block system. In addition, a compact space-saving arranged is obtained.

In addition, tower structures for high-voltage systems are known, in which the active components are enclosed and thus form a module. Due to the modular design, twice as many air and leakage paths exist, which leads to large dimensions and therefore to a large overall volume. Furthermore, all the individual stories are covered with baffles. In different high-voltage systems or different rectifier stations, tower structures are different since the towers do not consist of uniform elements. In addition, the voltage leads are arranged as an independent column structure outside the valve tower since there is no room in the tower.

SUMMARY OF THE INVENTION

It is an objective of the invention to construct a tower structure for high voltage systems in such a manner that high-voltage systems can be constructed by the building block system independently of the transmission line or the number of active components, wherein a compact space-saving arrangement is to be achieved.

According to the invention, this objective is accomplished by the provision that the support bars and metallic cross bars enclose, by means of the node elements a rectangular area, with a support rib structure of insulating cross and longitudinal supports is arranged in said area and that a cylindrical support body with an axially arranged cylindrical core is provided as a cup-shaped node element. The node element is provided with a cylindrical surface with two orthogonal fastening bolts arranged at right angles to the end faces of the support body, and that the cylindrical core is connected at its end faces to axially arranged studs.

In the tower design for high-voltage systems according to the invention, a frame of similar interconnected node elements, insulators, support bars and metallic cross bars is constructed, wherein a support rib structure each is arranged in the surrounded area of each story. The node elements of each story are laid out as connecting elements for the support bars. The metallic cross bars and the insulators which support the individual stories of the tower structure arranged on top of each other. In addition, they form, due to the arrangement of the fastening posts arranged on the outer surface, the outer tower outlines. The node elements shield the tower electrically from the environment, by inhibiting partial discharges. Thereby, a tower design for high-voltage systems is obtained which can be built-up from block modules independently of the transmission power and/or the number of active components. In addition, specially trained personnel is not needed either for the design nor in the assembly.

In one advantageous embodiment of the tower design, a cylindrical core is provided with a cylindrical axially arranged bore wherein one end of the bore is enlarged; a threaded rod is arranged, by means of a threaded nut and the enlarged end, in the bore of the node element, and the free ends of the threaded rods protrude as studs from the bore of the node element.

With this advantageous embodiment, the node elements can be manufactured inexpensively in quantity production and are preferably metallic. In addition, the parts of the tower structure are further simplified, according to a building block system, in such a manner that only blocks used as individual elements of the building block system, whereby the manufacture of the structure becomes less expensive.

In a further advantageous embodiment of the tower structure outdoor (open-air) insulators are provided as insulators with a fiberglass-reinforced plastic core, and the ends of the outdoor insulators are each provided with a blind hole having an internal thread. In this embodiment, open air insulators are provided because they have a pronounced rib shape which interrupts the wetting upon direct spray-water contact and thereby, no flashover takes place. By the fiberglass-reinforced plastic core, the tower structure is given additional stability even if in case of damage, for instance, a blow against the support insulator, the cast resin of the open air insulators is broken.

In a further advantageous embodiment of the tower structure, the metallic cross bars and the node elements serve for carrying the current. Thereby separate parts for leading the current to the active components for all practical purposes are not necessary. In addition, with every metallic, open structure, each story is given a favorable potential gradient which is very easy to control.

In a further embodiment of the tower structure, there is arranged in each story of the tower structure, an overvoltage arrester, the ends of which are connected to a supporting rib structure.

By the integration of the overvoltage arrester into the tower, the volume of the tower structure is reduced further. In addition, completed and pretested units can be used for the assembly of the tower so that the large number of parts to be mounted is minimized.

In a particularly advantageous embodiment of the tower structure, two opposite sides of each story are additionally provided with a central node element which is arranged between the respective node elements of the opposite sides, and this central node element is provided with two fastening posts for the insulator support bars and two fastening posts for the metallic cross bars.

By this additional node element, the current-carrying bars are tied electrically to the center of the story so that the potential of the structure is cut in half. Several tower structures can be mounted side by side in a small space. Thus, a minimum volume is obtained for a multi-valve high-voltage system, i.e., several valve towers arranged side by side.

BRIEF DESCRIPTION OF THE DRAWINGS

For a further explanation of the invention, reference is made to the drawings, in which a preferred embodiment of the invention for high-voltage systems is illustrated schematically.

DETAILED DESCRIPTION OF THE INVENTION

Figure 1:
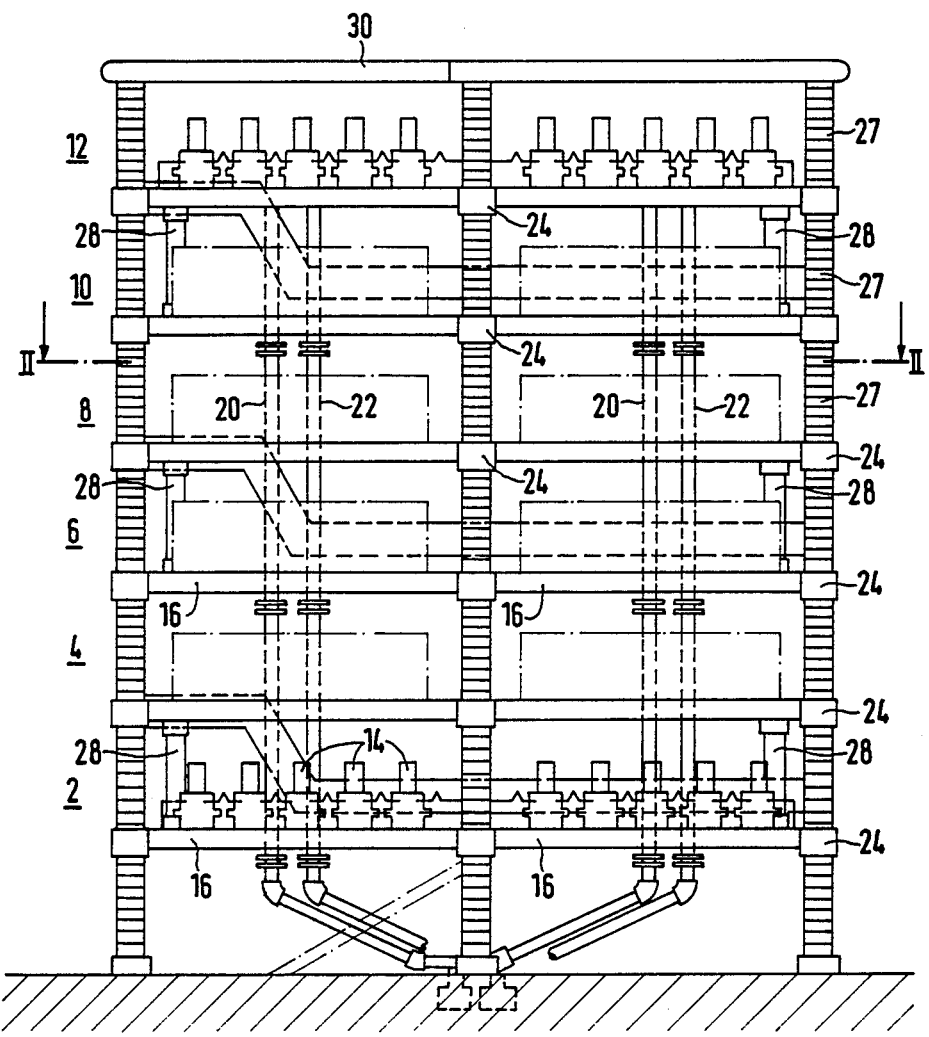
FIG. 1 shows a tower structure according to the invention, with a node element arranged in the center.

In FIG. 1, a tower design for a high-voltage system, for instance, a dual rectifier tower of a high-voltage d-c transmission system is shown. In a stacked design, active components 14, for instance, controlled converter rectifiers are arranged side by side in six stores 2, 4, 6, 8, 10 and 12. For instance, the controlled converter rectifiers 14 may be disposed on transversal support bars 16 and longitudinal supports. The rectifiers may be liquid-cooled thyristors. Each story 2, 4, 6, 8, 10 and 12 of the tower structure is supplied with cooling liquid from a common cooling liquid feedline 20 onto a common cooling liquid discharge line 22. The coolant flows off the thyristors. Every story 2, 4, 6, 8, 10 and 12 contains several node elements 24, several support bars 16 and several metallic cross bars 26, as can be seen in detail from FIG. 2. The stories 2, 4, 6, 8, 10 and 12 are connected to each other by outdoors type insulators 27 which are connected to the node elements 24. (See FIG. 3). In addition, an overvoltage arrester 28 is integrated in the tower structure in several stories 2, 6, and 8. The distribution of the overvoltage arresters 28 in the tower structure is dictated by the requirements of the electrical equipment in the tower. The ends of the overvoltage arrester 28 are provided with discharge points which lead out of the tower. If an overvoltage arrester 28 is defective, an arc can be discharged from the rectifier region via the discharge points and by means of the forces which act through the opposite current bar guidance, whereby secondary damage is prevented. The topmost story 12 is covered up by a roof 30, which is likewise connected via outdoor insulators 27 to the node elements 24 of this story 12. By this design, a tower structure is obtained which is constructed from several building modules. The tower can be expanded independently of the transmission power or the number of active components 14. Since the active components 14 are accommodated individually in the modules, the overall volume of the tower can be reduced in accordance with the dielectric strength. Also the inclusion of the overvoltage arrester 28 in the tower reduces the overall volume of the tower structure of a rectifier tower of a HVDC system. Because the parts of the tower which are screwed to each other are standardized, specially trained personnel is not required. In addition, the tower structure can be used for all applications in high-voltage engineering. Thus, a building block system is obtained which ensures a simple design of tower structures of high-voltage systems.

Figure 2:
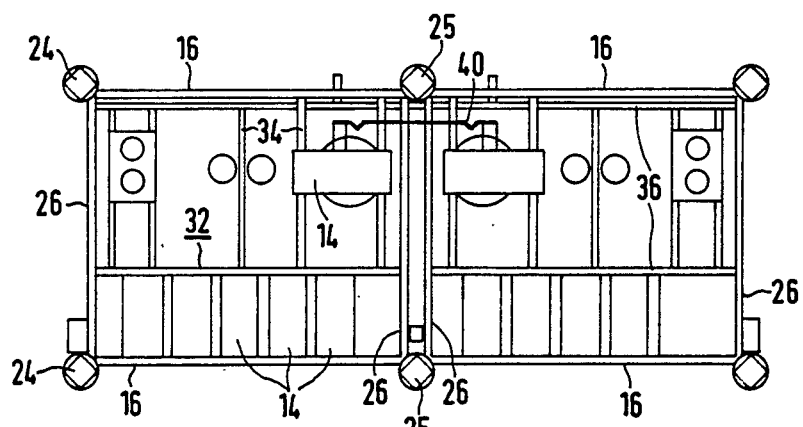
FIG. 2 shows a section along the line II—II of FIG. 1.

FIG. 2 shows a section along the line II—II of FIG. 1. This section illustrates the design of the stories 2, 4, 6, 8, 10 and 12 of the tower structure for high-voltage systems. Every story 2, 4, 6, 8, 10 and 12 of the tower structure contains at least two support bars 16 of insulating material and two metallic cross bars 26 which surround a rectangular area by means of the node elements 24. A supporting rib structure 32 is arranged in this surrounded area. The supporting rib structure 32 consists of a transverse and a longitudinal beam 34 and 36 of insulating material which are connected to each other and to the support bars as well as the metallic cross bars 26. The active components 14, for instance, thyristors, are supported by a support bar 16 and a longitudinal support 36 and two cross supports 34. Moreover, two opposite sides of each story 2, 4, 6, 8, 10 and 12 are additionally provided with a central node element 25 which is arranged between the node elements 24 of the opposite sides. This central node element 25 is provided with two fastening posts 38 for the insulating support bars 16 and two fastening posts 38 for the metallic cross bars 26. The design of the fastening posts 38 can be seen in FIG. 3. As insulating transverse and longitudinal supports 34 and 36 of the support rib structure 32 can be provided flat profile bars or prismatic hollow beams. The metallic cross bars 26 can be fabricated from an extruded section. In addition, the metallic cross bars 26 and the node elements 24 and 25 serve to carry the current. As shown in FIG. 2, a central tie comprising a current-carrying bar 40 in the center of the story is preferably provided at the ends of the stories is cut in half, whereby a very favorable potential gradient is created which can be controlled very simply. By this identical design of each story 2, 4, 6, 8, 10 and 12, a stable tower which can be assembled simply is obtained. Due to the identical structure of the stories 2, 4, 6, 8, 10 and 12, a tower for high-voltage systems can be fabricated with a corresponding number of stories without further expenditures for design and development.

Figure 3:
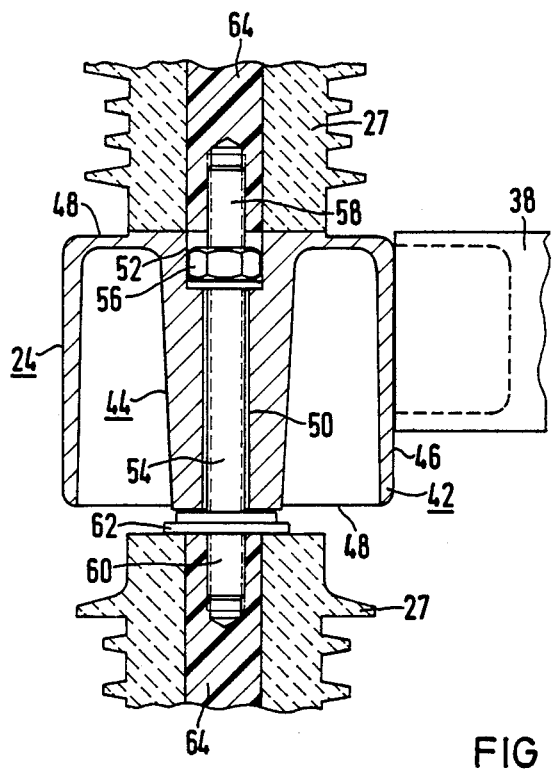
FIG. 3 illustrates a node element of the tower structure according to the invention.

In FIG. 3, a section along a cup-shaped node element 24 is shown. The cup-shaped node element 24 is provided a cylindrical support body 42 with a cylindrical core 44 which is arranged axially therewith. The cylinder surface 46 of the node element 24 is provided with two fastening posts 38 mentioned above which are arranged at right angles to each other and at right angles to the end faces 48 of the support body 42. The cylindrical core 44 of the support body 42 is provided with a bore 50 which is arranged cylindrically and axially. This bore 50 is provided with an enlarged end at 52. Through the bore 50 a threaded rod 54 is provided which is supported by means of enlarged end 52 and a threaded nut 56 in such a manner that the free ends of the threaded rod 54 protrude from the support body as threaded posts 58 and 60. Onto these threaded posts 58 and 60, an outdoor insulator 27 each is screwed. Between the cylindrical core 44 and the one outdoor insulator 27, spacer washers 62 are further arranged. In addition, equalizing bearings can also be used. The spacer washers 62 serve for leveling the tower during construction; the equalizing bearings have the purpose to prevent transverse forces when the screws are tightened. The outdoor insulators 27 have a pronounced rib shape, so that the wetting is interrupted in case of direct spray water contact. This prevents arcing over. In addition, the outdoor insulators 27 are provided with a fiberglass-reinforced plastic core 64. So that the outdoor insulators 27 can be screwed on the threaded posts 58 and 60, the outdoor insulators 27 are each provided at their ends with a blind hole having internal threads.

This blind hole is arranged in the fiberglass-reinforced plastic core 64. Thus the line of action of the forces on the insulator is on a straight line and goes centered through the outdoor insulators 27 and the node elements 24 and therefor through the entire rectifier tower. By the fiberglass-reinforced plastic core 64, the valve tower is given additional strength. In case of damage, for instance, a blow against the outdoor insulator 27, the fiberglass reinforced plastic core 64 provides sufficient strength if the cast resin is fractured, so that the valve tower cannot collapse. The node elements 24 also simply the design of the tower structure by the use of individual modules. Thereby, the manufacture of the individual modules is simple and the assembly into a tower is cost- effective.

What is claimed is:

1. A tower for high-voltage systems comprising:
   several stories which are connected to each other by means of insulators, each story consisting of support bars (16) of electrically insulating material, metallic cross bars (26) and cup-shaped node elements (24), wherein said bars (16) and said metallic cross bars (26) are interconnected by node elements (24) to enclose a rectangular area;
   a supporting rib structure (32) of insulating transverse and longitudinal supports (34, 36) arranged in said areas;
   said node elements including a cylindrical support body (42) with an axially arranged cylindrical core (44), a cylindrical surface (46), and end faces (48); and
   two fastening posts (38) arranged at right angles to each other and right angles to said end faces (48) of the support body (42), said cylindrical core (44) being connected at said end faces (48) to axially arranged studs (58, 60).

2. The tower design according to claim 1, wherein said cylindrical core (44) is provided with a cylindrically and axially arranged bore (50), one end of said bore (50) being enlarged (52), further comprising a threaded rod (54) arranged in said bore (50) and a threaded nut (56) disposed at said enlarged end; said threaded rod (54) having free ends protruding from said throughhole (50).

3. The tower design according to claim 1, further comprising outdoor insulators (27) each having a fiberglass-reinforced plastic core (64), said insulators having end faces provided with blind holes, with internal threads for securing said insulators to said node elements.

4. The tower design according to claim 1, wherein said metallic cross bars (26) and said node elements (24) serve for carrying the current.

5. The tower design according to claim 1, further comprises several overvoltage arresters (28) connected to a support rib structure.

6. The tower design according to claim 5, wherein said voltage arresters are provided with discharge points leading out of the tower.

7. The tower design according to claim 1, further comprising active components (14) which are individually arranged on the supporting rib structure (32).

8. The tower design according to claim 1, wherein in each story has two opposite sides which are provided with a central node element (25) which are arranged between the node elements (24); said central node element (25) including fastening posts (38) for said insulating support bars (16) and said metallic cross bars (26).

* * * * *